United States Patent
Lazic et al.

(10) Patent No.: US 9,136,087 B2
(45) Date of Patent: Sep. 15, 2015

(54) METHOD OF INVESTIGATING AND CORRECTING ABERRATIONS IN A CHARGED-PARTICLE LENS SYSTEM

(71) Applicant: FEI Company, Hillsboro, OR (US)

(72) Inventors: Ivan Lazic, Eindhoven (NL); Gijs van Duinen, Utrecht (NL); Peter Christiaan Tiemeijer, Eindhoven (NL)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/016,997

(22) Filed: Sep. 3, 2013

(65) Prior Publication Data

US 2014/0061464 A1    Mar. 6, 2014

Related U.S. Application Data

(60) Provisional application No. 61/696,402, filed on Sep. 4, 2012.

(30) Foreign Application Priority Data

Sep. 4, 2012   (EP) ..................................... 12182874

(51) Int. Cl.
    *H01J 37/153*   (2006.01)
(52) U.S. Cl.
    CPC ....... *H01J 37/153* (2013.01); *H01J 2237/1534* (2013.01)
(58) Field of Classification Search
    CPC ........ H01J 37/153; H01J 37/304; H01J 37/26
    USPC ................................. 250/306, 307
    See application file for complete search history.

(56) References Cited

U.S. PATENT DOCUMENTS

| | | | |
|---|---|---|---|
| 4,095,104 A | * | 6/1978 | LePoole et al. ............... 250/311 |
| 5,084,622 A | | 1/1992 | Rose |
| 5,747,814 A | * | 5/1998 | Gordon et al. ............... 250/398 |
| 5,838,011 A | | 11/1998 | Krijn et al. |
| 5,986,269 A | | 11/1999 | Krijn et al. |
| 6,184,975 B1 | | 2/2001 | Henstra et al. |

(Continued)

FOREIGN PATENT DOCUMENTS

| | | |
|---|---|---|
| JP | 57111936 A  * | 7/1982 |
| JP | S57-111936 | 7/1982 |
| JP | H06-223761 | 8/1994 |

OTHER PUBLICATIONS

Glaeser, Robert M., "Precise beam-tilt alignment and collimation are required to minimize the phase error associated with coma in high-resolution cryo-EM," Journal of Structural Biology, 2011, pp. 1-10, vol. 174.

(Continued)

*Primary Examiner* — Nicole Ippolito
*Assistant Examiner* — Wyatt Stoffa
(74) *Attorney, Agent, or Firm* — Scheinberg & Associates, PC; Michael O. Scheinberg

(57) ABSTRACT

A system of investigating aberrations in a charged particle lens system, wherein a charged particle beam is directed from a multitude of directions through a pivot point on a sample stage. An image figure is recorded for each of multiple focus settings at each beam direction setting, creating a set of registered images. This set of images is compared to reference images to derive aberrations present in the lens system without the use of an amorphous sample present.

19 Claims, 4 Drawing Sheets

(56) References Cited

U.S. PATENT DOCUMENTS

| | | |
|---|---|---|
| 6,191,423 B1 | 2/2001 | Krijn et al. |
| 6,246,058 B1 | 6/2001 | Tiemeijer |
| 6,992,289 B2 | 1/2006 | Maes et al. |
| 7,186,975 B2 * | 3/2007 | Ishitani et al. ............... 250/310 |
| 7,378,667 B2 | 5/2008 | Henstra |
| 7,544,939 B2 | 6/2009 | van der Zande et al. |
| 7,915,584 B2 | 3/2011 | Tiemeijer et al. |
| 8,447,133 B2 | 5/2013 | Rieger et al. |
| 8,569,693 B2 | 10/2013 | Bischoff et al. |
| 8,692,196 B2 | 4/2014 | Tiemeijer et al. |
| 2002/0047096 A1 * | 4/2002 | Goto ..................... 250/492.2 |
| 2002/0079448 A1 * | 6/2002 | Ishitani et al. ............... 250/310 |
| 2007/0158567 A1 * | 7/2007 | Nakamura et al. ............ 250/311 |
| 2008/0290264 A1 * | 11/2008 | Henstra et al. ............. 250/252.1 |
| 2010/0072366 A1 | 3/2010 | Tiemeijer et al. |
| 2011/0114852 A1 | 5/2011 | Henstra |
| 2012/0153146 A1 * | 6/2012 | Hirose et al. ................ 250/310 |
| 2013/0062520 A1 | 3/2013 | Henstra et al. |
| 2013/0068949 A1 * | 3/2013 | Urano et al. ................ 250/310 |
| 2013/0105689 A1 | 5/2013 | Bischoff et al. |
| 2013/0256531 A1 * | 10/2013 | Yoshida et al. ............... 250/307 |
| 2013/0266240 A1 * | 10/2013 | Rieger et al. ................ 382/275 |
| 2014/0211185 A1 * | 7/2014 | Cramer et al. ................. 355/67 |

OTHER PUBLICATIONS

Unknown, "Seidel vs. Zernike," http://www.sinopt.com/learning1/desnotes/seizern.htm., copyright 1998, 1 pg.

Uhlemann, Stephan, et al., 'Residual wave aberrations in the first spherical aberration corrected transmission electron microscope,' Ultramicroscopy, 1998, pp. 109-119, vol. 72.

Glaeser, Robert M., et al., "Precise beam-tilt alignment and collimation are required to minimize the phase error associated with coma in high-resolution cryo-EM," Journal of Structural Biology, 2011, pp. 1-10, vol. 174.

Morniroli, J.P., et al., "LACDIF, a new electron diffraction technique obtained with the LACBED configuration and a Cs corrector: Comparison with electron precession," Ultramicroscopy, 2008, pp. 100-115, vol. 108.

Zemlin, F., et al., "Coma-Free Alignment of High Resolution Electron Microscopes With the Aid of Optical Diffractograms," Ultramicroscopy, 1978, pp. 49-60, vol. 3.

* cited by examiner

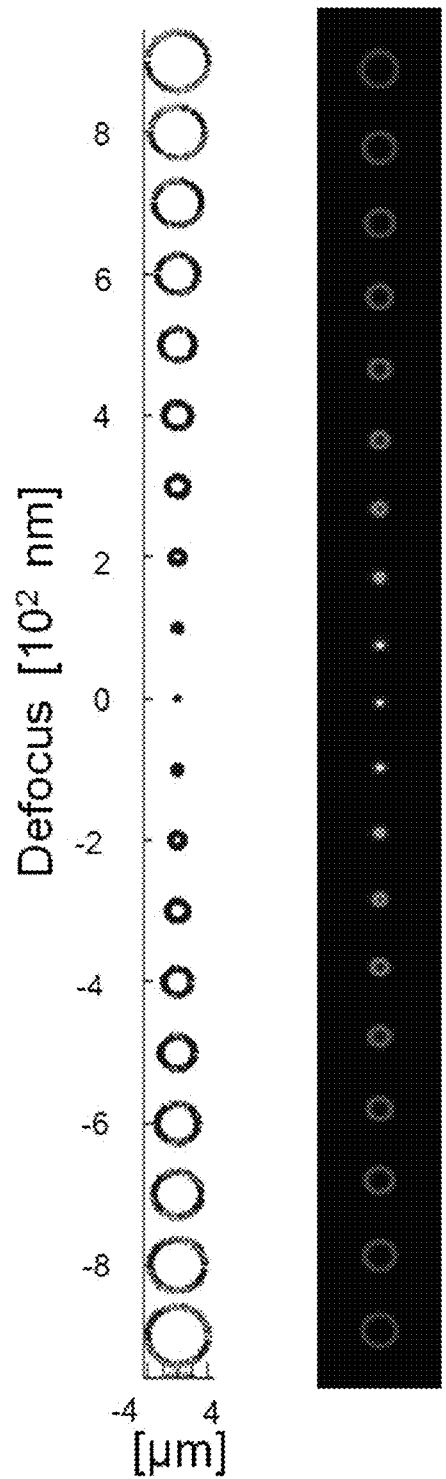
FIG. 3A
FIG. 3B

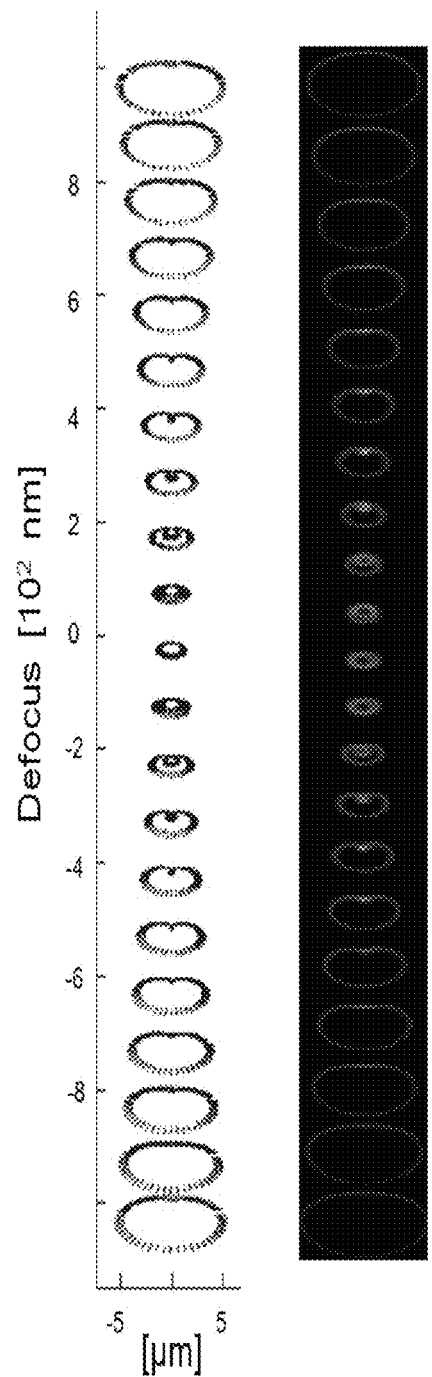
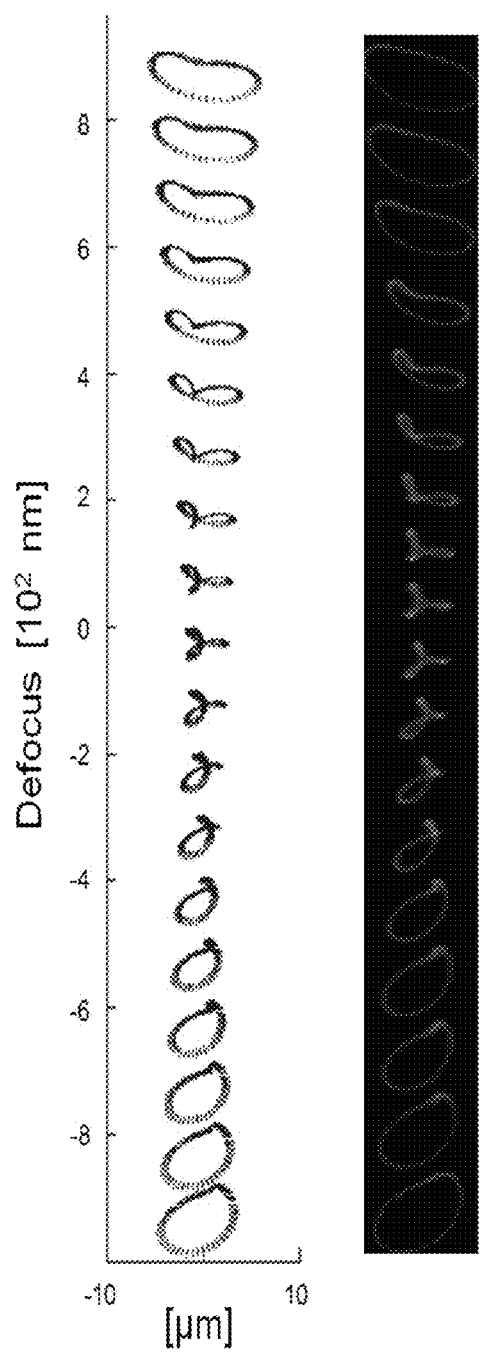
FIG. 3C                    FIG. 3D

METHOD OF INVESTIGATING AND CORRECTING ABERRATIONS IN A CHARGED-PARTICLE LENS SYSTEM

This Application claims priority from U.S. Provisional Application 61/696,402, filed Sep. 4, 2012, which is hereby incorporated by reference.

The invention relates to a method of investigating aberrations in a charged-particle lens system, which lens system has an object space comprising an object plane and an image space comprising an image plane, whereby an object placed on said object plane can be imaged by the lens system onto said image plane, the lens system further having an entrance pupil.

The invention also relates to a charged-particle microscope comprising:
- A charged-particle source, for producing a charged-particle beam;
- A sample holder, for holding and positioning a sample;
- A charged-particle lens system, for imaging at least a portion of said sample onto an image plane;
- A detector, for detecting an image of said sample at said image plane.

For purposes of clarity and consistency, the following terms as used throughout this text and the appended claims should be interpreted as follows:
- The term "charged particle" encompasses an electron or ion (generally a positive ion, such as a Gallium ion or Helium ion, for example, though a negative ion is also possible). It may also be a proton, for example.
- The term "charged-particle lens system" refers to a system of one or more electrostatic and/or magnetic lenses that can be used to manipulate a charged-particle beam, serving to provide it with a certain focus or deflection, for example, and/or to mitigate one or more aberrations therein. In addition to (various types of) conventional lens elements, the charged-particle lens system (particle-optical column) may also comprise elements such as deflectors, stigmators, multipoles, aperture (pupil) plates, etc.
- The term "charged-particle microscope" (CPM) refers to an apparatus that employs at least one charged-particle lens system to create a magnified image of an object, feature or component that is generally too small to be seen in satisfactory detail with the naked human eye. In addition to having an imaging functionality, such an apparatus may also have a machining functionality; for example, it may be used to locally modify a sample by removing material therefrom ("milling" or "ablation") or adding material thereto ("deposition"). Said imaging functionality and machining functionality may be provided by the same type of charged particle, or may be provided by different types of charged particle; for example, a Focused Ion Beam (FIB) microscope may employ a (focused) ion beam for machining purposes and an electron beam for imaging purposes (a so-called "dual beam" microscope, e.g. a "FIB-SEM"), or it may perform machining with a relatively high-energy ion beam and perform imaging with a relatively low-energy ion beam.
- The term "sample holder" refers to any type of table, platform, arm, etc., upon which a sample can be mounted and held in place. Generally, such a sample holder will be comprised in a stage assembly, with which it can be accurately positioned in several degrees of freedom, e.g. with the aid of electrical actuators.

Such concepts will be familiar to the skilled artisan.

In what follows, the invention will by way of example often be set forth in the specific context of electron microscopes. However, such simplification is intended solely for clarity/illustrative purposes, and should not be interpreted as limiting.

Electron microscopy is a well-known technique for imaging microscopic objects. The basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" beam of ions, allowing supportive activities such as ion-beam milling or ion-beam-induced deposition, for example. In traditional electron microscopes, the imaging beam is "on" for an extended period of time during a given imaging session; however, electron microscopes are also available in which imaging occurs on the basis of a relatively short "flash" or "burst" of electrons, such an approach being of potential benefit when attempting to image moving samples or radiation-sensitive specimens, for example.

A CPM such as a TEM will typically employ a system of several lenses to image an object plane onto an image plane; this system is conventionally referred to as a "projection system" (projection column, projection lens system). In this projection system, each successive lens may progressively magnify an image from a preceding lens, so as to attain a cumulative magnification factor of up to the order of a million. The first lens (at the object end) of such a projection system is conventionally called the "objective lens". When imaging a sample using a CPM, the quality of the obtained image will be influenced inter alia by the presence/extent/nature of aberrations in the employed projection system, and particularly by aberrations in the objective lens which tend to dominate because they are magnified by all successive lenses in the projection system. Well-known examples of such aberrations include spherical aberration, astigmatism and coma, but there are also more "exotic" aberrations, such as so-called threefold and fivefold astigmatism, for example. Modern TEMs (CPMs) may thus employ an aberration correction set-up in (or near) the projection system, which set-up can comprise a plurality of lenses and multipoles (for example) for the purpose of compensating prominent aberrations in the objective lens (and/or other lens elements).

It is important to be able to detect and quantify the presence of lens aberrations, so that optimally-tailored corrective measures can be taken; for example, knowing the direction and magnitude of astigmatism in a charged-particle lens allows corrective stigmator elements to be excited in such a way as to cancel said astigmatism to a substantial extent, leading to improved imaging results. Besides the use of stigmators, lens aberrations can also be mitigated using optical devices such as (series of) appropriate electrostatic or magnetic multipoles, for example.

One known way to perform a method as set forth in the opening paragraph involves the placement of an amorphous sample (or, at least, an amorphous region of a sample) in the object plane of the lens system, and the passage of a charged-particle beam through it. The amorphous nature of the sample material in the beam path causes the beam to be scattered and "fanned out" into a broad cone, so as to substantially fill the entrance pupil of the lens system. The resulting intensity distribution at the image plane is detected, and its Fourier Transform (FT) calculated (the aforementioned broad cone geometry serving to ensure that all spatial frequencies in the lens system are sufficiently sampled). Specific details of an interference process between scattered and un-scattered beam components cause certain spatial frequencies to be extinguished in the resulting image. These extinguished (non-transferred) spatial frequencies manifest themselves as dark ellipses in the FT, which are conventionally referred to as "Thon rings". Analysis of the position/shape of these Thon rings can yield quantitative values for symmetric aberrations (e.g. defocus, twofold astigmatism, spherical aberration, etc.). However, asymmetric aberrations (e.g. coma, three-fold astigmatism, etc.) do not affect the position of the Thon rings, and such aberrations can only be measured from a collection of FTs of several images takes at various cone angles/fanning angles of the charged particle beam. For more information on this known method, see (for example) the following journal article:

F. Zemlin, K. Weiss, P. Schiske, W. Kunath and K-.H. Herrmann, "*Coma free alignment of electron microscopes with the aid of optical diffractograms*", Ultramicroscopy 3 (1978), pp. 49-60.

This known method has certain drawbacks. For example:
It requires the presence of an amorphous (region of a) sample. This tends to slow down the procedure, because of the time required to load and position such a sample.
It is mathematically complicated: analyzing the calculated FT and trying to quantify the positions of Thon rings often proves to be very difficult, especially when the image is noisy.
It only works if the charged-particle beam and lens system are correctly aligned, or close to correct alignment; the method fails completely in the event of substantial misalignment. More specifically, the known method will fail if the degree of misalignment is such that no Thon rings are formed. This can happen in the presence of (for example) substantial beam tilt, a substantially off-axis beam, substantial de-focus, substantial values of certain aberrations (e.g. coma or astigmatism), etc.
Aberrations of odd symmetry e.g. coma cannot be divined from a single image obtained in this known manner, but require time-consuming multiple imaging sessions (as alluded to above).
Accordingly, the known method has limited usefulness.

It is an object of the invention to address these issues. More specifically, it is an object of the invention to provide a method as set forth in the opening paragraph, which method does not require the presence of a sample at the object plane. In addition, it is an object of the invention that such a method should be relatively insensitive to the degree of (mis-)alignment between a lens system and the charged-particle beam traversing it. In particular, it is an object of the invention that the new method should be capable of satisfactorily investigating a wide scala of lens aberrations, including coma and other asymmetric aberrations. Additionally, it is an object of the invention that such a method should lend itself to correction of aberrations (whether manual or automatic, e.g. feed-back-controlled), e.g. so as to (periodically) correct a lens system that has drifted from a pre-determined optimum condition.

These and other objects are achieved in a method as specified in the opening paragraph, characterized by the following steps:
Selecting a fixed pivot point on said object plane;
Directing a charged-particle beam through said pivot point, entrance pupil and lens system and onto said image plane, said beam having a relatively small cross-sectional area relative to the area of the entrance pupil;
Changing the orientation of said beam through said pivot point, so as to trace out an entrance figure on said entrance pupil and a corresponding image figure on said image plane;
Registering said image figure;
Repeating this procedure at a series of different focus settings of the lens system, thus acquiring a set of registered image figures at different focus settings;
Analyzing said set so as to derive lens aberrations therefrom.

With regard to the terminology used here, the following should be noted:
The pivot point is an abstract point through which the charged-particle beam is directed and "precessed" so as to trace out said entrance figure. In effect, it will be the apex of a cone (or cone-like) volume traced out by the beam in the space between the object plane and entrance pupil. It is only fixed during acquisition of said set of registered images; once said set is acquired, a new pivot point for a new measurement session may be chosen, if desired.
Said cross-section of the charged-particle beam may be relatively small because the beam is focused. Alternatively/supplementally, one may use a collimated beam with a curtailed cross-section.
Said image figure registration may be performed in different ways. For example, one may use at least one electronic detector (such as a CMOS or CCD detector), or one may employ a fluorescent screen on which to view the image figures with the naked eye and/or record them on a data carrier, etc.

The method according to the present invention differs from the known method in several important aspects. For example:
The known method uses a broad beam to completely fill the entrance pupil, thus simultaneously achieving rays of different tilt. In contrast, the method of the present invention uses a relatively thin (small) beam to trace out a figure (such as a circle) on the entrance pupil (whereby only a portion of the entrance pupil need be traversed by the beam), whence different tilt directions of the beam are achieved serially rather than simultaneously. In general, the smaller the (focus of the) beam at the pivot point, the better. Also, the smaller the beam at the entrance pupil of the lens system, the better. The beam thickness/cross-section can, for example, be suitably adjusted using beam manipulating apparatus such as a condenser lens, diaphragm, etc.
Because it does not need to scatter the beam into a broad cone, the present invention does not require the presence of an amorphous (portion of a) sample at the object plane unlike the known method, which can only be performed with suitable amorphous scattering material in the beam path. That having been said, the current method will not necessarily fail if the pivot point is located within/against (solid or liquid material of) a sample, but such a sample should then preferably be substantially transparent to said beam (or, at least, as transparent as possible).
The known method entails a relatively complicated mathematical analysis technique (FT calculation and positional recognition of dark Thon rings), with which it is relatively difficult to deconvolve a "mixed bag" of assorted aberrations; on the other hand, the mathematical analysis employed in the current invention (analysis of image figures at different focus settings) is generally easier and more robust in nature (inter alia because the studied image figures are well-defined geometrical shapes on a plain background).

The method of the current invention acquires a set of image figures at different focus settings of the lens system (for example, through best focus (under-focus/best focus/over-focus). The known method does not adjust focus settings of the lens system as part of its aberration investigation recipe.

These and other differences will be elucidated in greater detail below.

According to the present invention, the analyzing step alluded to above may comprise performing a mathematical fit of said set (of registered image figures at different focus settings) to a collection of theoretical image figures predicted using a mathematical model. In this approach, one adopts a parametrized mathematical model that describes the manner in which the lens system converts an input object into an aberrated output image. One then uses this model to predict a collection of theoretical image figures for the employed entrance figure (e.g. a circle of a given radius) and focus settings (e.g. best focus+ten steps on each side of best focus at distance increments of 100 nm). The next step (mathematical fit) can then involve two different approaches, namely:

A determinative approach (passive approach). Here, the collection of predicted figures is brought into agreement with the set of measured figures by appropriately tuning the various parameters of the model. Once (optimal) agreement has been reached, the tuned values of the model parameters can be used to distill values for various lens aberrations.

A corrective approach (active approach). Here, one seeks to bring the set of measured figures into agreement with a collection of idealized predicted figures, generated by the model using parameters that correspond to no (or very little) lens aberration. To this end, one tunes certain aspects of the lens system (e.g. by adjusting excitation currents) and/or one deploys one or more dedicated electrical correcting devices (e.g. stigmators, deflector coils, deflector electrodes) situated proximal the beam path, thus adjusting the lens aberrations observed at the image plane. In this way, one manipulates a real image to as to make it agree as closely as possible with an ideal image.

The present invention allows either or both of these approaches to be pursued, and allows them to be conducted manually and/or automatically (e.g. in an automated feedback loop). It should be noted that the correcting devices alluded to here are referred to as "electrical" in that they are excited by an electrical input; their output, on the other hand, may be an electric field or magnetic field, for example. For instance, a stigmator is a magnetic multipole (e.g. sextupole) in which an electrical excitation produces a magnetic field which can be used to mitigate astigmatism effects in an electron-beam lens system, for example. As an alternative to a stigmator, one can use a relatively simple deflector to produce a beam tilt that can be used to mitigate coma, for example. In the case of ion-beam lens systems, it is generally preferable to employ correcting devices that produce an electrostatic field rather than a magnetic field.

In a particular embodiment of a method as set forth in the previous paragraph, the employed mathematical model describes wavefront deformation by the lens system in terms of localized alterations in phase (and phase gradient) per point on a wavefront, using a two-dimensional function. For example, consider a planar wavefront on which various points can be referenced using a two-dimensional co-ordinate system (in the current case Cartesian, though Polar is also possible, for example). As the wavefront traverses the lens system (whose optical axis extends parallel to axis z), a given infinitesimal area at a point on the wavefront will, according to this model, undergo:

A phase shift $\phi(x, y)$;

A tilt T (pitch and/or yaw, referenced to z), being a localized gradient value of $\phi(x, y)$, either of which may have a value of zero for a given point. One now uses physical knowledge of what various aberrations entail, and one formulates functions of $\phi(x, y)$ and T that describe the geometrical shape of the wavefront associated with each aberration. For example, simple astigmatism will produce a cylindrical deformation of the wavefront, whereas spherical aberration will produce a spherical deformation, etc., and such deformations can be described in terms of (parametrized) geometrical functions; the cumulative (resultant) aberration produced by the lens system is then the sum of such functions.

In a further aspect of a method as set forth in the previous paragraph, said two-dimensional function is expanded as a Taylor Series, whose coefficients yield information on the magnitude of various lens aberrations. For example, if we represent a wavefront traversing a lens system by the symbol $\Psi$, then a functional dependence between the wavefront entering and exiting the lens system (parallel to an optical axis z) can be represented by the equation:

1.

$$\Psi_{exit} = \Psi_{in} e^{-ik\phi(x,y)}; \quad k = 2\pi/\lambda \tag{1}$$

in which $\phi(x, y)$ represents phase and $\lambda$ denotes wavelength (and x, y, z are Cartesian coordinates). The two-dimensional function $\phi(x, y)$ can be expanded as a Taylor series as follows:

$$\phi(x, y) = \sum_{n=0}^{\infty} \sum_{m=0}^{\infty} \frac{1}{n!m!} \left( \frac{\partial^{n+m} \phi(x, y)}{\partial x^n \partial y^m} \right)_{\substack{x=0 \\ y=0}} x^n y^n \tag{2}$$

$$= \sum_{n=0}^{\infty} \sum_{m=0}^{\infty} a_{nm} x^n y^m$$

yielding a two-dimensional polynomial expression with terms in x, y, xy, $x^2$, $y^2$, $x^2y$, $y^2x$, $x^3$, $y^3$, etc. The various coefficients $a_{nm}$ of this polynomial can then be grouped together in such a way as to correspond to so-called Seidel aberration coefficients, for example (or, alternatively, to so-called Zernike aberration coefficients, for example, or to variants/hybrids of such coefficients). Using this functional form, one can calculate what image figures will result (at different positions along z, or, equivalently, at a fixed position along z but using different focal strengths (defocusing) of the lens system) from a given entrance figure. When these are compared to the actual image figures that the lens system produces from that same entrance figure, one can:

Adjust the coefficients of the polynomial so as to produce a good fit between calculation and observation; the resulting coefficient values then yield the various aberration values (e.g. via said Seidel coefficients);

Adjust lens parameters (e.g. excitations, deflector settings, corrector settings) so as to produce an optimum fit between observation and an idealized calculation; one then "manipulates" the lens system into adopting a preselected set of aberrations (e.g. minimum aberrations).

For more information on Seidel/Zernike coefficients, reference is made to the following publication, for example:

a Design Note entitled "Seidel vs. Zernike" "on the web site of Sinclair Optics, under the Learning tab.

As already stated above, a difference between the current invention and the aforementioned known method is that the current invention uses a data set acquired at a series of different focus settings. One aspect of this difference is that, by acquiring data at different focus settings, the present invention allows a qualitative analysis that is not possible with the known method; for example, a mere visual inspection of FIGS. 3B and 3D will tell the skilled artisan much information about the nature of the lens aberrations underlying the figures, inter alia due to the substantial evolution in shape/size of the various image figures as a function of defocus. In addition, the quantitative aspect of the current invention exploits the diversity of focus settings in order to match the number of available image figures to the number of variables employed in the associated mathematical analysis. When fitting data to a mathematical model, it is desirable to have an over-determined fit (or, at least, not to have an under-determined fit): the skilled artisan will know this, and will be able to choose an appropriate number of focus settings to match the number of floating variables in a particular model—which, in turn, will depend on the number of aberrations that one seeks to quantify. In many cases, 6-12 different focus settings will prove to be sufficient to determine a number of lower-order aberrations, such as spherical aberration, common astigmatism and coma. Although not strictly necessary, it is often preferable to choose at least one point in said series of focus settings to be at, or proximal to, best focus: brief inspection of FIGS. 3A-3D again shows that there is much interesting evolution in image figure shape in the vicinity of best focus. In many cases, it will be useful to choose a series of focus settings that straddles best focus, so as to include under-focus and over-focus points (infra-focus and ultra-focus).

In the method according to the present invention, the entrance figure traced out on the entrance pupil (via appropriate excitation of one or more deflectors upstream of the object plane, continually directing the beam through the selected pivot point) can have various possible shapes. Non-limiting examples include circles, spirals, a square matrix of points, a plurality of concentric circles, etc. The skilled artisan will be able to choose a particular entrance figure (or figures) so as to optimally match the mathematical model he is using and/or the types of aberration that he is principally interested in investigating. An advantage of using a circle as entrance figure, for example, is that it facilitates visual/qualitative identification of various common aberrations, by virtue of the characteristic image figures into which it is transformed in different scenarios. For example:

In a perfect, aberration-free lens system, the best-focus image of an entrance circle is a point (being a perfect image of the selected pivot point). Assume that this occurs at a particular position F of the image plane.

In the presence of only spherical aberration, the image of an entrance circle at said position F is now a circle rather than a point, whose radius is indicative of the magnitude of the spherical aberration.

Presence of any non-axial symmetric aberration (i.e. any aberration other than spherical aberration) will convert an entrance circle into image figures that are not circular (or point-like). Some of these image figures are readily recognizable: for example, astigmatism produces ellipses, coma produces shapes that are reminiscent of eggs or teardrops, and combined astigmatism/coma produces star-like figures. In the case of pure astigmatism (without other aberrations), the eccentricity of the resulting image ellipse yields information on the magnitude of the astigmatism.

Other entrance figures may have other or similar advantages.

A particular embodiment of the method according to the present invention comprises the following steps:

Using a first entrance figure, a first set of registered image figures is obtained at a first series of different focus settings;

Using a second entrance figure, different to said first image figure, a second set of registered image figures is obtained at a second series of different focus settings;

Said analyzing step is performed on combined data from said first set and said second set.

It should be noted in this regard that the second entrance figure may be different from the first entrance figure in one or more of the following ways: size, shape, orientation, position. For example, the first and second entrance figures may be circles of different radii, or may be ellipses of different eccentricity and/or orientation, or one may be a circle and the other may be a square, and so forth. It should also be noted that positions in the second series of focus settings may or may not correspond to positions in the first series, according to choice/circumstances. An advantage of this embodiment is that, by providing further data to work with, it can facilitate said analyzing step; for example, it can assist in rendering the above-mentioned mathematical fit (sufficiently) over-determined. Another advantage of this embodiment is that it allows acquisition of data pertaining to (substantially) different zones of the entrance pupil: for example, if one uses a relatively small and a relatively large entrance circle, then one will acquire data pertaining to both inner and outer regions of the entrance pupil. Needless to say, if desired, one may extend this embodiment to include further sets of image figures acquired for additional entrance figures.

As an alternative to the embodiment in the previous paragraph, one could choose a single entrance figure of non-constant radius; in such a scenario, one automatically samples different zones of the entrance pupil when tracing out the entrance figure.

In some designs of CPM, the objective lens may be so thick (in the direction of the optical axis) that it does not fit entirely downstream of the object plane, and part of it will be located upstream of the object plane (i.e. in the so-called illumination system rather than in the projection system). In such a set-up, there is thus effectively an auxiliary lens system located upstream of the object plane (i.e. at its side distal from the image plane). In such an instance, the method according to the current invention will, in fact, measure the combined aberrations of both the projection system (downstream of the object plane) and said auxiliary lens system (upstream of the object plane). The aberrations in this auxiliary lens system may not be negligible compared to the aberrations of the projection system; however, there is a relatively simple solution to correct the aberrations in this auxiliary lens system, so that their role can be discounted. This solution involves periodic calibration of the illumination system (upstream of the object plane) so that it produces a pivot point that is accurately located within the object plane. Depending on the particular circumstances of a given CPM (thermal drift, sample charging, etc.), such calibration may, for example, be performed once a week or less/more often, as required.

It should be noted that some types of studies performed in a CPM cannot tolerate any field at the object plane, e.g. because the magnetic properties of a sample are being investigated. In such a CPM, the objective lens is switched off so that the auxiliary lens system referred to in the previous paragraph is effectively removed. This type of (lower-magnification) microscopy is referred to as "Lorentz microscopy". In a Lorentz microscope, the method of the current invention will only measure aberrations in the projection system.

As set forth above, the method of the present invention measures the combined aberrations of all lenses involved in imaging the object plane onto the image plane. In order to separate the contributions of particular lens elements, the current method can, if desired, be extended from tilting at one pivot point to tilting at two or more appropriately chosen pivot points. In this context, it should be noted that, if a given pivot point is chosen so as to be located in the center (heart) of a particular lens element (while concurrently being located in the object plane of the combined remaining lens elements a scenario attainable using appropriate focus settings of the lens elements), then the aberrations of that particular lens element will not contribute to image formation in the image plane. This can be used to discriminate between the aberrations coming from that particular lens element and the aberrations coming from the combined action of all other lens elements.

It will be clear to the skilled artisan that, as regards its application in a CPM, the current invention is of particular relevance in investigating/correcting lens aberrations in a TEM, since the optics in a TEM have a pronounced imaging functionality. Nevertheless, the inventive method may also be used to investigate/correct lens aberrations in other types of CPM, such as STEM, for example. As already stated above, ion-based (or proton-based) CPMs may also benefit from application of the inventive method.

It should be noted that one could conceive a variant of the current invention whereby the object plane is relatively far away from the lens system in question, whence the charged-particle beam could be considered as impinging upon the lens system substantially perpendicularly (for an object plane considered (by approximation) to be at infinity). In such a scenario, one could observe image figures on a back focal plane of the lens system. Such a construction falls within the scope of the current elucidation and claims.

BRIEF DESCRIPTION OF THE DRAWINGS

The invention will now be elucidated in more detail on the basis of exemplary embodiments and the accompanying schematic drawings, in which:

FIGS. 3A-3D depict series of calculated and observed image figures for a series of focus increments through best focus resulting from a given circular entrance figure and pertaining to a charged-particle lens system investigated using a method according to the present invention.

In the Figures, where relevant, corresponding parts are indicated using corresponding reference symbols.

DETAILED DESCRIPTION OF SEVERAL EMBODIMENTS

Embodiment 1

Figure 1:
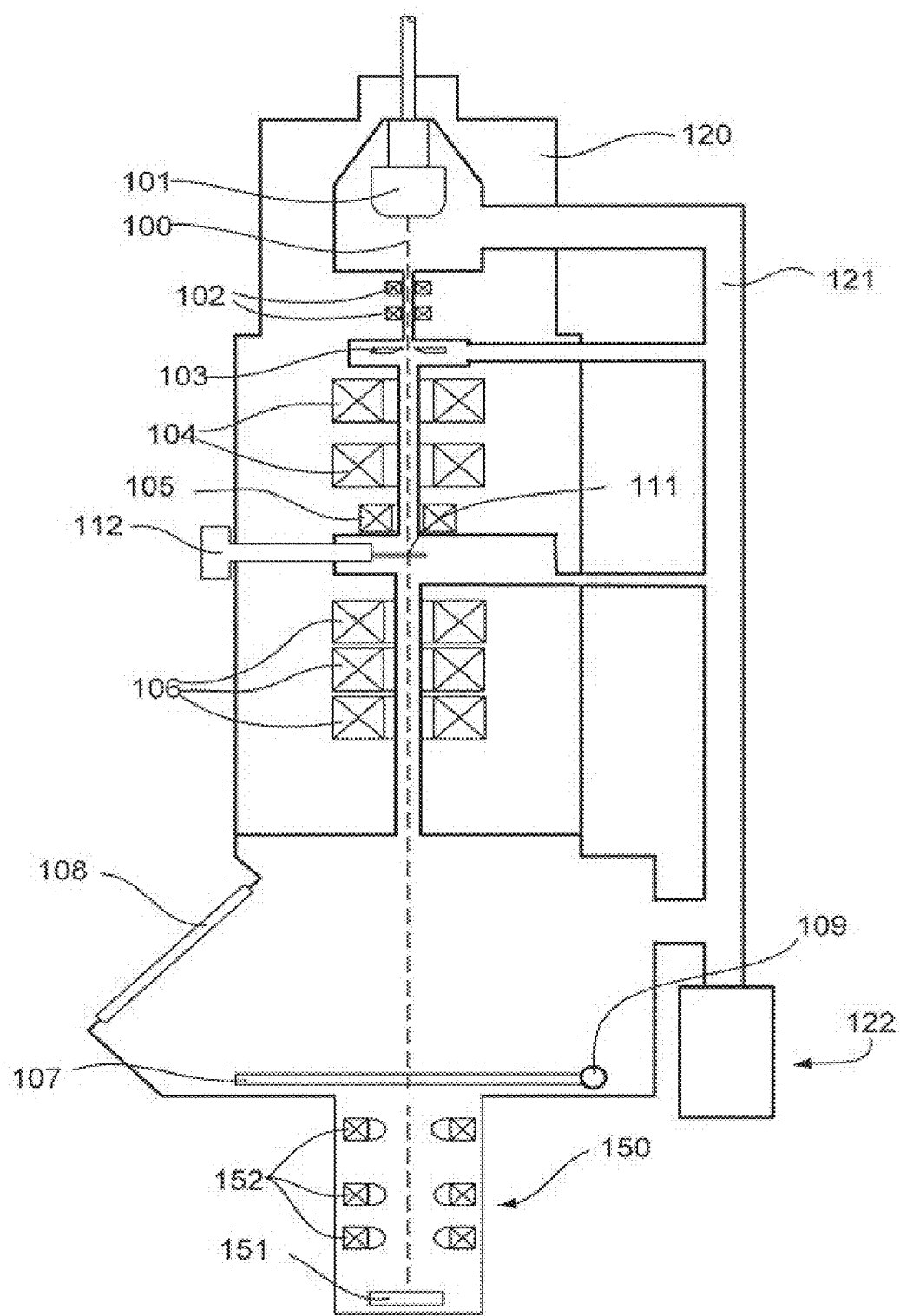
FIG. 1 renders a longitudinal cross-sectional view of part of a charged-particle microscope (TEM) in which a method according to the present invention can be enacted.

FIG. 1 renders a highly schematic longitudinal cross-sectional view of a particular embodiment of a CPM in which the current invention can be applied. In the present instance, the CPM is a TEM.

The depicted TEM comprises a vacuum housing 120 that is evacuated via tube 121 connected to a vacuum pump 122. A particle source in the form of an electron gun 101 produces a beam of electrons along a particle-optical axis (imaging axis) 100. The electron source 101 can, for example, be a field emitter gun, a Schottky emitter, or a thermionic electron emitter. The electrons produced by the source 101 are accelerated to an adjustable energy of typically 80-300 keV (although TEMs using electrons with an adjustable energy of 50-500 keV, for example, are also known). The accelerated electron beam then passes through a beam limiting aperture/diaphragm 103 provided in a platinum sheet. To align the electron beam properly to the aperture 103, the beam can be shifted and tilted with the aid of deflectors 102, so that the central part of the beam passes through the aperture 103 along axis 100. Focusing of the beam is achieved using magnetic lenses 104 of a condenser system, together with (part of the) final condenser lens 105. Deflectors (not depicted) are used to center the beam on a region of interest on a sample, and/or to scan the beam over the surface of the sample. In this schematic, functional depiction, the deflectors 102 are shown relatively high up in the CPM, and final condenser lens 105 is shown as being relatively small; however, the skilled artisan will appreciate that deflectors 102 may be much lower in the CPM (e.g. nested within the lens 105), and that item 105 may be much larger than depicted.

The sample to be examined is held by a sample holder 112 in such a manner that it can be positioned in the object plane 111 of projection system 106 (whose uppermost lens element is conventionally referred to as an objective lens, as already set forth earlier). The sample holder 112 may offer various positional/motional degrees of freedom (one or more of translation(s), pitch, roll and yaw), and may also have temperature control functionality (heating or cryogenic). It may be a conventional type of sample holder for holding a static sample in a containment plane; alternatively, the sample holder 112 can be of a special type that accommodates a moving sample in a flow plane/channel that can contain a stream of liquid water or other solution, for example.

The sample is imaged by projection system (projection lens system, projection column) 106 onto fluorescent screen 107, and can be viewed through a window 108. The enlarged image formed on the screen typically has a magnification in the range $10^3 x$-$10^6 x$, and may show details as small as 0.1 nm or less, for example. The fluorescent screen 107 is connected to a hinge 109, and can be retracted/folded away such that the image formed by the projection system 106 impinges upon primary detector 151. It is noted that, in such an instance, the projection system 106 may need to be (slightly) re-focused so as to form the image on the primary detector 151 instead of on the fluorescent screen 107. It is further noted that the projection system 106 may additionally form intermediate images at intermediate image planes (not depicted).

The primary detector 151 may, for example, comprise a Charge-Coupled Device (CCD) for detecting impinging electrons, or a CMOS device, for instance. As an alternative to electron detection, one can also use a CCD that detects light—such as the light emitted by a Yttrium Aluminium Garnet (YAG) crystal (for example) that is bonded to the CCD, or connected thereto by optical fibers (for example). In such an indirect detector, the YAG crystal emits a number of photons when an electron hits the crystal, and a portion of these photons is detected by the CCD camera; in direct detectors, electrons impinge on the semiconductor chip of the CCD and generate electron/hole pairs, thereby forming the charge to be detected by the CCD chip. The detector 151 is connected to a processing apparatus (controller) and display unit [not depicted].

The image formed on the fluorescent screen 107 and on the primary detector 151 is generally aberrated due (for example) to imperfections produced in the projection system 106. To correct such aberrations, various multipoles can be deployed in/near the projection system 106. Such multipoles are not depicted in FIG. 1, so as to avoid cluttering the drawing, but the skilled artisan will be familiar with their design, positioning and implementation.

In some TEMs, it is desirable to be able to divert the electron beam in a direction away from the optical axis 100, e.g. so as to direct it into an EELS detector (EELS=Electron Energy-Loss Spectroscopy). Such diversion can be achieved with the aid of deflectors 152, for example.

It should be noted that FIG. 1 only shows a schematic rendition of a (simplified) TEM, and that, in reality, a TEM will generally comprise many more deflectors, apertures, etc.

In the context of the current invention, it may, on occasion, be desirable to perform one or both of the following actions:
Investigate the (type and magnitude of) aberrations occurring in the projection lens system 106;
Adjust parameters of one or more components of the TEM so that lens aberrations observed during imaging operations assume certain values (e.g. zero, or lowest practicable values, or some other pre-determined set of values).

To this end, a procedure such as the following can be followed:
The sample holder 112 is left free of a sample, or is positioned such that any sample held thereon does not intercept the optical axis 100. This is not strictly necessary, but any sample material traversed by the beam will tend to adversely affect the precision of the current method. If sample material is present, it should preferably be as transparent as possible to the employed beam.
With the aid of deflectors 102, aperture 103 and/or condenser lenses 104, a relatively narrow electron beam is produced. This beam has a relatively small cross-sectional area (e.g. of the order of about 30%, or less) relative to the area of an (undepicted) entrance pupil of the objective lens of projection system 106.
A fixed pivot point is chosen. In a case whereby on-axis aberrations are to be investigated, this pivot point will be at the intersection of the object plane 111 of the projection system 106 and its optical axis 100. However, it is also possible to choose a pivot point that is within the object plane 111 but is displaced away from the optical axis 100, in which case off-axis aberrations can be investigated. Regardless of any tilt that it might have with respect to the optical axis 100, the electron beam will always be directed through this pivot point.
Using (for example) deflectors 102, the electron beam is tilted with respect to the optical axis 100 and is "precessed" about the optical axis 100 so as to trace out an (undepicted) entrance figure (e.g. a circle or ellipse) on said entrance pupil. The projection system 106 will then transform said entrance figure into a corresponding image figure (not shown in FIG. 1, but depicted in FIG. 3). This image figure can be visually observed on the screen 107 and/or electronically registered by the detector 151, as desired/required by the tool user; the former option lends itself to qualitative investigation of aberrations, whereas the latter option will generally be more suitable in the case of a quantitative investigation.

This procedure of converting an entrance figure into a corresponding image figure is repeated for a series of different (incremental) focus settings, e.g. through and on either side of best focus. These focus settings can be adjusted by appropriately varying certain parameters of the projection system 106.

Once a set of image figures is acquired in this manner, it can be analyzed so as to derive various (types and magnitudes) of lens aberrations therefrom. An example of how this can be achieved will be given in the next Embodiment.

Embodiment 2

Figure 2:
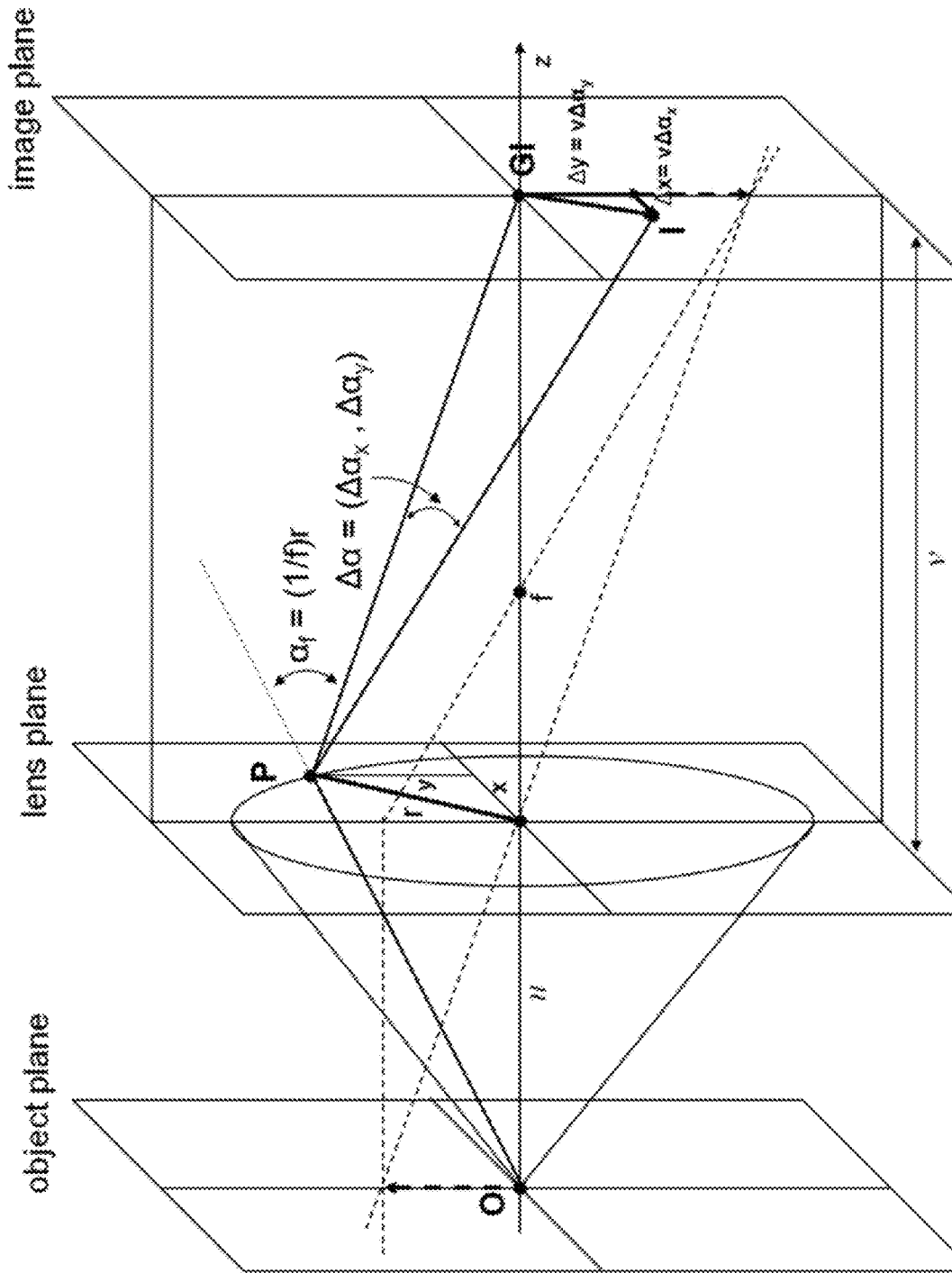
FIG. 2 is an illustration of certain geometrical/optical constructs that can be used to elucidate certain aspects of the current invention.

FIG. 2 is an illustration of certain geometrical/optical constructs that can be used to elucidate certain aspects of the current invention.

In the Figure, an optical axis of an undepicted lens system extends along an axis z of a Cartesian coordinate system. From left to right along this axis z, three planes are illustrated, which respectively represent an object plane, entrance pupil (lens plane of equivalent thin lens) and image plane of said lens system. These planes are mutually parallel, and are normal to z. The distance between the object plane and entrance pupil is u, whereas the image between the entrance pupil and image plane is v.

Depicted on the object plane is a fixed pivot point O, which, in the current case, lies upon the axis z. A ray is drawn from this pivot point O to a point P on the entrance pupil, and from there on to a point GI (Gaussian Image) on the image plane; this ray represents the path of a light beam in a perfect lens, without any aberration. Also depicted is a ray from the point P to an image I on the image plane; this ray represents the path of a light beam in a realistic lens, in the presence of aberration. The effect of said aberration is to cause the realistic image I to be displaced from the perfect image GI. Expressed angularly, this displacement is $\Delta\alpha$, which can be regarded as having components $\Delta\alpha_x$ and $\Delta\alpha_y$ along the x- and y-axes, respectively.

The point P has x and y coordinates. In the current scenario, in accordance with the present invention, the orientation of a beam through pivot point O is changed, so as to trace out an entrance figure on the entrance pupil. As here depicted, the entrance figure is a circle of radius r, which can be represented by an equation $x^2+y^2=r^2$. In a perfect lens, all points on this circle would be imaged onto point GI; however, in a realistic lens (with aberration), the point I will trace out an image figure on the image plane in response to the (circular) entrance figure traced out by point P on the entrance pupil.

The method of the current invention registers a set of such image figures for a given entrance figure and for a series of (de-)focus settings, which can be regarded as corresponding to different positions of the image plane along the z axis. The method develops a mathematical model based on a phase function $\phi(x, y)$ that describes changes to wavefronts occurring at the entrance pupil. Further details of this model are set forth in the discussion above and below.

If desired, the total lens action represented by the function $\phi(x, y)$ can be split into an ideal component $\phi_{ideal}(x, y)$ causing perfect imaging and a non-ideal component $\chi(x, y)$ representing aberrations, such that:

$$\phi(x,y)=\phi_{ideal}(x,y)+\chi(x,y).$$

In such an instance, the aforementioned displacement angle components $\Delta\alpha_x$ and $\Delta\alpha_y$ can be expressed as:

$$\Delta\alpha_x = \frac{\partial \chi(x, y)}{\partial x}$$

$$\Delta\alpha_y = \frac{\partial \chi(x, y)}{\partial y}$$

i.e. as a vector gradient of $\chi(x, y)$. On the other hand, a perfect refraction angle without the presence of aberration could be expressed as a gradient of $\phi_{ideal}(x, y)$.

For good order, FIG. 2 illustrates that, in accordance with the present invention, an off-axis pivot point can also be chosen; this is represented by the dashed arrow extending upward from the on-axis point O on the object plane. Such a shift in the position of the pivot point on the object plane will cause a corresponding shift in the position of the image on the image plane as schematically indicated by the dashed arrow on that plane.

Embodiment 3

FIGS. 3A-3D depict sets of calculated and observed image figures for a series of focus increments through best focus resulting from a given circular entrance figure and pertaining to a charged-particle projection system in a TEM investigated using a method according to the present invention. In each of FIGS. 3A-3D:

The left hand column shows a set of calculated image figures corresponding to a series of different (de-)focus settings of the lens system in question, in increments of 100 nm. The vertical graduated scale shows the (cumulative) amount of defocus for a given figure, whereas the horizontal graduated scale shows the size of the figures in microns.

The right hand column shows the corresponding registered/observed figures actually produced by the TEM projection system. These figures are recorded one at a time, but are stacked here to aid comparison with the left column.

There is excellent agreement between the calculated and observed sets of figures, because various parameters of the model (coefficients of the series expansion) used to generate the calculated figures have been accurately fitted to the observed figures.

Now, in more detail:

The situation in FIG. 3A essentially corresponds to a perfectly aligned lens system with only spherical aberration. Note that the image figure at best focus is a point, and that the other image figures are circles.

The situation in FIG. 3B essentially corresponds to a lens system with only common (twofold) astigmatism (and the possible presence of some spherical aberration). Note that the image figures are now ellipses whose eccentricity depends on the amount of defocus.

The situation in FIG. 3C essentially corresponds to a lens system with only coma (and the possible presence of some spherical aberration). Note that the image figures are now pillow-shaped.

The situation in FIG. 3D corresponds to a lens system with both common astigmatism and coma (and the possible presence of some spherical aberration). Note that the image figures can show shapes varying from teardrop-shaped to star-like to bean-shaped, depending on defocus value.

From a mere visual inspection of these image figures, much qualitative information (and also some quantitative information) can be gleaned with regard to the aberrations present in the lens system in question. Much more quantitative information can be derived when the calculated and observed image figure sets are fitted/tuned to one another, as here depicted and as set forth in detail above. In the case of the situation in FIG. 3A, acquiring two sets of image figures using two different entrance circles (of different radii) will allow a value of the observed spherical aberration to be calculated.

Embodiment 4

According to Equation (2) above, the phase function $\phi(x, y)$ can be expanded as a two-dimensional polynomial. The various terms $a_{nm} x^n y^m$ in this polynomial can be re-grouped into specific clusters. For example:

$$\phi(x,y) = a_{00} + a_{10}x + a_{01}y + a_{20}x^2 + a_{11}xy + a_{02}y^2 + a_{20}x^3 + a_{21}x^2y + a_{12}xy^2 + a_{03}y^3 + a_{40}x^4 + a_{31}x^3y + a_{22}x^2y^2 + a_{13}x^1y^3 + a_{04}y^4 + a_{50}x^5 + a_{41}x^4y^1 + a_{32}x^3y^2 + a_{23}x^2y^3 + a_{14}x^1y^4 + a_{05}y^5 + \qquad (3)$$

in which the various clusters have the following physical significance:

| | |
|---|---|
| First cluster ($a_{00}$) | Shift along z |
| Second cluster ($a_{10} x + \ldots$) | Deflection (tilt) |
| Third cluster ($a_{20} x^2 + \ldots$) | Defocus + $1^{st}$-order aberrations |
| Fourth cluster ($a_{30} x^3 + \ldots$) | $2^{nd}$-order aberrations |
| Fifth cluster ($a_{40} x^4 + \ldots$) | $3^{rd}$-order aberrations |
| Sixth cluster ($a_{50} x^5 + \ldots$) | $4^{th}$-order aberrations | and so forth. The polynomial in each of these clusters can be re-written in terms of other coefficients, e.g. (quasi-)Seidel aberration coefficients. For example, it is possible to re-write the third cluster above as follows:

$$a_{20}x^2 + a_{11}xy + a_{02}y^2 = \frac{1}{2}C_{10}(x^2 + y^2) + C_{12b}xy + \frac{1}{2}C_{12a}(y^2 - x^2) \qquad (4)$$

$$= \frac{1}{2}(C_{10} - C_{12a})x^2 + C_{12b}xy + \frac{1}{2}(C_{10} + C_{12a})y^2$$

so that:

$$a_{20} = \frac{1}{2}(C_{10} - C_{12a}) \; a_{11} = C_{12b} \; a_{02} = \frac{1}{2}(C_{10} + C_{12a}) \qquad (5)$$

and thus $$C_{10} = a_{20} + a_{02} \; C_{12b} = a_{11} \; C_{12a} = a_{20} + a_{02} \qquad (6)$$

where:

$C_{10}$ is the Seidel coefficient associated with de-focus;

$C_{12a}$ and $C_{12b}$ are the Seidel coefficients associated with common/two-fold astigmatism. The other clusters set forth above can similarly be re-written in terms of Seidel coefficients. For example, the fourth cluster (second-order aberrations: $a_{30} x^3 + \ldots$) can be re-written in the form:

$$\phi_{aberr2}(x,y) = \frac{1}{3}(C_{21a}x + C_{21b}y)(x^2+y^2) + \frac{1}{3}C_{23a}x(x^2 - 3y^2) + \frac{1}{3}C_{23b}y(y^2 - 3x^2) \qquad (7)$$

in which:

$C_{21a}$ and $C_{21b}$ are the Seidel coefficients associated with coma;

$C_{23a}$ and $C_{23b}$ are the Seidel coefficients associated with three-fold astigmatism.

It should be explicitly noted that equations (3)-(7) can also be expressed in Polar coordinates. In that case, the pair of Seidel coefficients $C_{12a}$ and $C_{12b}$ "condense" into a single coefficient $C_{12}$, with a similar "condensation" for the Seidel pair $C_{21a}$ and $C_{21b}$ and the Seidel pair $C_{23a}$ and $C_{23b}$, etc.

In this manner, it is possible to re-write equation (3) in terms of particular coefficients—such as Seidel coefficients (or, alternatively, Zernike coefficients or some other set of coefficients) thus making it easier to model/identify various lens aberrations using the methodology of the current invention.

The invention claimed is:

1. A method of investigating aberrations in a charged-particle lens system, the lens system having an object space comprising an object plane and an image space comprising an image plane, whereby an object placed on said object plane can be imaged by the lens system onto said image plane, the lens system further having an entrance pupil, the method comprising:
   selecting a fixed pivot point on said object plane;
   directing a charged-particle beam through said pivot point, entrance pupil and lens system and onto said image plane, said beam having a cross-sectional area of about 30% or less of the area of the entrance pupil;
   changing the orientation of said beam through said pivot point, so as to trace out an entrance figure on said entrance pupil and a corresponding image figure on said image plane;
   registering said image figure;
   repeating this procedure at a series of different focus settings of the lens system, thus acquiring a set of registered image figures at different focus settings; and
   analyzing said set so as to derive lens aberrations therefrom.

2. The method according to claim 1, wherein said analyzing step comprises performing a mathematical fit of said set to a collection of theoretical image figures predicted using a mathematical model.

3. The method according to claim 2, wherein said mathematical model describes wavefront deformation by the lens system in terms of localized alterations in phase and phase gradient per point on a wavefront, using a two-dimensional function.

4. The method according to claim 3, wherein said two-dimensional function is expanded as a Taylor Series, whose coefficients yield information on the magnitude of various lens aberrations.

5. The method according to claim 1, wherein said series of different focus settings includes at least one point at, or proximal to, best focus.

6. The method according to claim 1, wherein said series of different focus settings straddles best focus, so as to include under-focus and over-focus points.

7. The method according to claim 1, wherein said entrance figure is at least approximately a circle.

8. The method according to claim 1, wherein:
   using a first entrance figure, a first set of registered image figures is obtained at a first series of different focus settings;
   using a second entrance figure, different to said first image figure, a second set of registered image figures is obtained at a second series of different focus settings;
   said analyzing step is performed on combined data from said first set and said second set.

9. The method according to claim 1, wherein the number of focus settings in said series of different focus settings is such as to cause said mathematical fit to be over-determined.

10. The method according to claim 1, wherein said analyzing step is used to derive at least one of spherical aberration, astigmatism and coma in said lens system.

11. The method according to claim 1, wherein, upstream of said object plane, a beam manipulating apparatus is employed to adjust the cross-sectional area of the charged-particle beam, which beam manipulating apparatus comprises a least one device selected from the group comprising a condenser lens, a diaphragm, and combinations hereof.

12. The method according to claim 1, wherein, pursuant to said analyzing step, at least one electrical correcting device is excited proximal to a path of the charged-particle beam so as to influence at least one derived aberration.

13. The method according to claim 12, wherein said electrical correcting device is selected from the group comprising stigmators, multipoles, deflector coils, deflector electrodes, and combinations hereof.

14. The method according to claim 12, wherein said beam manipulating apparatus is excited so as to tune an observed value of at least one aberration in said lens system to match a calculated value of that aberration.

15. The method according to claim 1, wherein, while tracing out each entrance figure, the charged particle beam does not intersect solid or liquid material at or proximal to said object plane.

16. The method according to claim 1, wherein said pivot point is selected so that it is not intersected by an optical axis of the lens system.

17. The method according to claim 1, wherein:
   using a primary pivot point, a primary set of registered image figures is obtained at a primary series of different focus settings;
   using a secondary pivot point, different to said primary pivot point, a secondary set of registered image figures is obtained at a secondary series of different focus settings;
   said analyzing step is performed on combined data from said primary set and said secondary set.

18. A charged-particle microscope comprising:
   a charged particle source for producing a charged particle beam;
   a sample holder for holding and positioning a sample;
   a charged particle lens system for imaging at least a portion of said sample onto an image plane, the lens system having an object space comprising an object plane and an image space comprising said image plane, whereby an object placed on said object plane can be imaged by the lens system onto said image plane, the lens system having an entrance pupil;
   a detector for detecting an image of said sample at said image plane; and
   a processing apparatus controller including instructions comprising:
   selecting a fixed pivot point on said object plane;
   directing the charged-particle beam through said pivot point, entrance pupil and lens system and onto said image plane, said beam having a cross-sectional area of about 30% or less of the area of the entrance pupil;
   changing the orientation of said beam through said pivot point, so as to trace out an entrance figure on said entrance pupil and a corresponding image figure on said image plane;
   registering said image figure;
   repeating this procedure at a series of different focus settings of the lens system, thus acquiring a set of registered image figures at different focus settings; and
   analyzing said set so as to derive lens aberrations therefrom.

19. The charged particle microscope of claim 18, wherein said analyzing step comprises performing a mathematical fit of said set to a collection of theoretical image figures predicted using a mathematical model.

* * * * *